(12) United States Patent
Li

(10) Patent No.: US 7,434,184 B2
(45) Date of Patent: Oct. 7, 2008

(54) METHOD FOR DETECTING FLAWS IN A FUNCTIONAL VERIFICATION PLAN

(76) Inventor: Zhe Li, 1 Argent Dr., Poughkeepsie, NY (US) 12603

( * ) Notice: Subject to any disclaimer, the term of this patent is extended or adjusted under 35 U.S.C. 154(b) by 252 days.

(21) Appl. No.: 11/450,701

(22) Filed: Jun. 9, 2006

(65) Prior Publication Data

US 2007/0033552 A1 Feb. 8, 2007

Related U.S. Application Data

(60) Provisional application No. 60/784,965, filed on Mar. 23, 2006, provisional application No. 60/706,502, filed on Aug. 8, 2005.

(51) Int. Cl.
*G06F 17/50* (2006.01)
(52) U.S. Cl. .............................. 716/5; 716/4
(58) Field of Classification Search ....................... 716/5
See application file for complete search history.

(56) References Cited

U.S. PATENT DOCUMENTS

| | | |
|---|---|---|
| 6,427,223 B1 | 7/2002 | Kim et al. |
| 6,523,151 B2 | 2/2003 | Hekmatpour |
| 6,553,514 B1 | 4/2003 | Baumgartner et al. |
| 6,647,513 B1 | 11/2003 | Hekmatpour |
| 6,651,227 B2 * | 11/2003 | Abadir et al. ................... 716/4 |
| 6,687,662 B1 | 2/2004 | McNamara et al. |
| 7,003,420 B2 | 2/2006 | Ur et al. |
| 7,114,111 B2 | 9/2006 | Noy |
| 2005/0278576 A1 | 12/2005 | Hekmatpour |
| 2006/0085713 A1 | 4/2006 | Takabatake |

2007/0243826 A1 * 10/2007 Liu .................... 455/67.11

OTHER PUBLICATIONS

D.Brand, Exhaustive simulation need not require an exponential number of tests, IEEE/ACM International Conference on Computer-Aided Design, Nov. 8-12, 1992, pp. 98-101.

M.Kantrowitz, L.M.Noack, I'm done simulating; now what? Proceedings of the 33rd annual conference on Design automation, 1996, pp. 325-330, ACM Press, New York, NY, USA.

R. Grinwald, et al. User defined coverage—a tool supported methodology for design verification, Proceedings of the 35th annual conference on Design automation, 1998, pp. 158.

J.Shen et al. Functional verification of the equator MAP1000 microprocessor, Proceedings of the 36th ACM/IEEE conference on Design automation, 1999, pp. 169-174.

S.Ur, Y.Yadin, Micro architecture coverage directed generation of test programs, Proceedings of the 36th ACM/IEEE conference on Design automation, 1999, pp. 175-180.

(Continued)

*Primary Examiner*—Jack Chiang
*Assistant Examiner*—Brandon W Bowers

(57) ABSTRACT

This method uses 2 copies of the design under test. These 2 copies use different values (including primary inputs and initial states) to feed the supposedly irrelevant logic while using the same (or consistent as desired) values to feed the feature being verified. Symbolic method is used to efficiently determine whether the feature being verified behaves identically (or consistently as expected) in the 2 copies for all possible cases in the supposedly irrelevant logic.

11 Claims, 11 Drawing Sheets

OTHER PUBLICATIONS

B.Bently, Validating the intel pentium 4 microprocessor, Proceedings of the 38th conference on Design automation, 2001, pp. 244-248, ACM Press, New York, NY USA.

K.Albin, Nuts and bolts of core and SoC verification, Proceedings of the 38th conference on Design automation, 2001, pp. 249-252, ACM Press, New York, NY USA.

J.Dunshina et al. Semi-formal test generation with genevieve, Proceedings of the 38th conference on Design automation, 2001, pp. 617-622, ACM Press, New York, NY USA.

A.Gluska, Coverage-oriented verification of Banias, Proceedings of the 40th conference on Design automation, 2003, pp. 280-285, ACM Press, New York, NY USA.

S.Fine, A.Ziv, Coverage directed test generation for functional verification using bayesian networks, Proceedings of the 40th conference on Design automation, 2003, pp. 286-291.

A.Adir et al. A generic micro-architectural test plan approach for microprocessor verification, Proceedings of the 42nd annual conference on Design automation, 2005, pp. 769-774.

D.W.Victor et al. Functional verification of the Power5 microprocessor and Power5 multiprocessor systems, IBM J. of Res. and Development, vol. 49, No. 4/5, Jul. 2005, pp. 541-553.

A.Gluska, Practical methods in coverage-oriented verification of the merom microprocessor, Proceedings of the 43rd conference on Design automation, 2006, pp. 332-337, ACM Press.

S.Gorai et al. Directed-simulation assisted formal verification of serial protocol and bridge, Proceedings of the 43rd conference on Design automation, 2006, pp. 731-736.

* cited by examiner

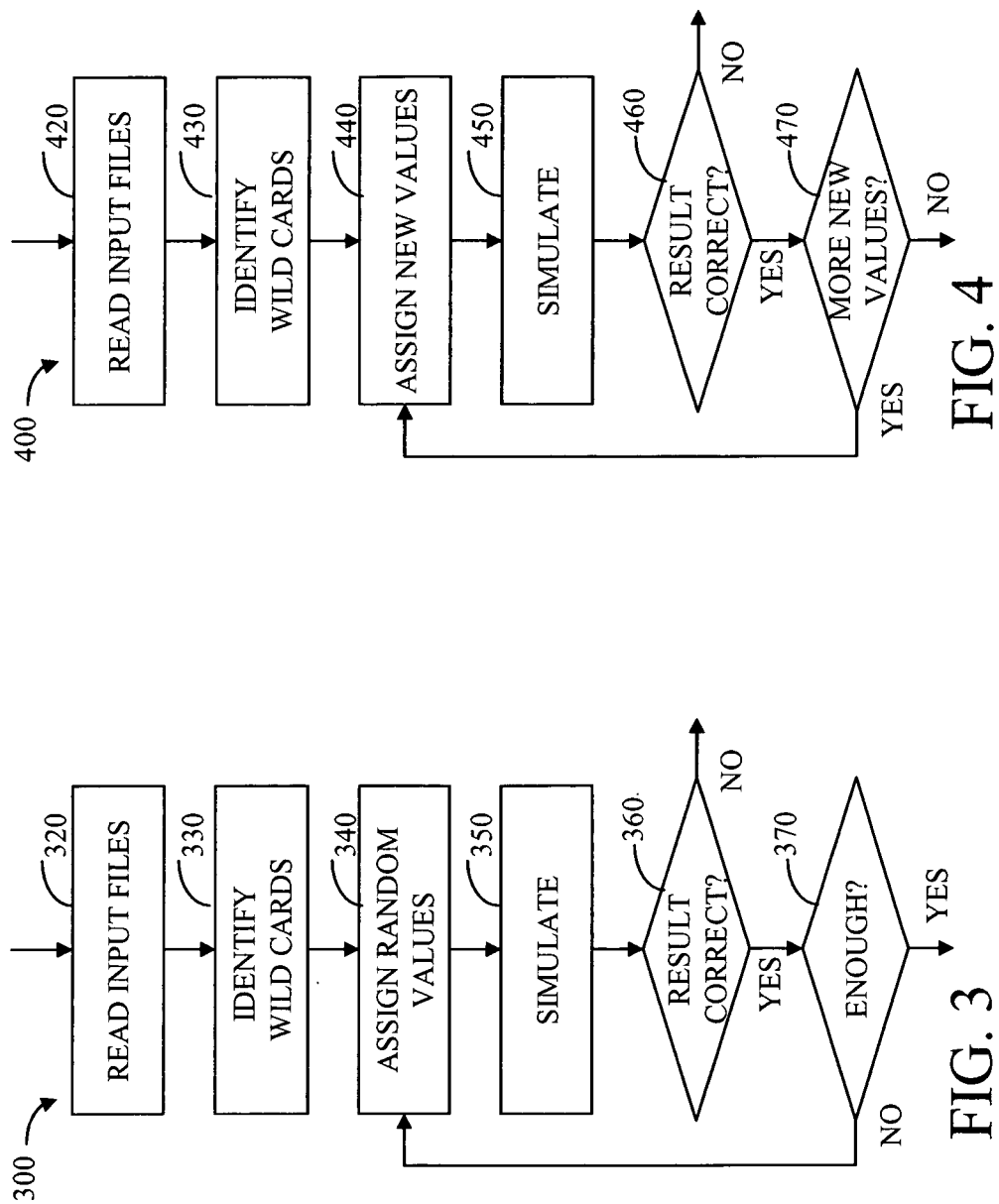

METHOD FOR DETECTING FLAWS IN A FUNCTIONAL VERIFICATION PLAN

CROSS-REFERENCE TO RELATED APPLICATIONS

This application is entitled to the benefit of provisional patent application No. 60/706,502, titled Interference Detection Method for Critiquing and Improving Verification Plans, and filed on Aug. $8^{th}$, 2005 by the present inventor, the contents of which are herein incorporated by reference.

This application is entitled to the benefit of provisional patent application No. 60/784,965, titled Method for Design Verification Using Test Bench Refinements, and filed on Mar. $23^{rd}$, 2006 by the present inventor, the contents of which are herein incorporated by reference.

STATEMENT REGARDING FEDERALLY SPONSORED RESEARCH OR DEVELOPMENT

Not Applicable.

REFERENCE TO A MICROFICHE APPENDIX

Not Applicable.

BACKGROUND OF THE INVENTION

This invention relates to electronic design automation, specifically to verification of electronic circuit designs' functional correctness using a computer program.

Electronic circuit designs have become very complex as VLSI technologies allow larger and larger chips. The cost of design mistakes gets higher and the chance of making mistakes also gets higher as VLSI chips get more and more complex. The complexity of functional verification has been so high that no modern VLSI design project can afford complete verification. All such projects do just as much verification as possible. They all need to reduce the verification complexity so that they can verify more with the resource limitation.

Simulation is the most efficient method to verify a feature of a VLSI design a bit: with one test case or a small number of test cases. However, simulation cannot go much beyond such a bit of verification due to the complexity. Some methods are better than simulation overall but they cannot get beyond certain levels of verification, either. There is a need to combine these methods and to use each only in the part that it is best at.

Simulation's efficiency is low when verifying unexpected interference. In a large design, a feature typically involves a small part of the logic at any time while the other parts are idle or used for other purposes at the same time. Unexpected participation of these other parts hurts this feature's functional correctness, and it has too many possibilities so that there is no way for simulation to check all or a good portion of these possibilities. There is no previously known method that just focuses on such unexpected interference or unexpected participation of supposedly irrelevant logic.

A special kind of unexpected interference is in the relevant logic. Control values in the relevant logic determines how other signals (including data values) are processed, but each data value is not supposed to determine how other data values are processed. Simulation can detect such problems with unexpected interference between data values, but it is not very productive. Therefore, as the data amount get larger, people give up on checking unexpected interference between data values with simulation. Such unexpected interference between data values causes functional mistakes, but it takes too much simulation effort to examine such issues thoroughly.

A verification plan typically defines how to use simulation (and possibly other methods) to verify the features of a VLSI design. An important part of the verification plan is the collection of test cases to use. The test cases in a flawed verification plan can be not enough or more than enough. The goal of reducing the verification complexity is to determine what test cases are just enough in a verification plan. If the verification plan includes functional coverage, the test cases in the verification plan are indirectly specified through the functional coverage goal. Then the goal of reducing the verification complexity is to determine whether the functional coverage goal is just enough.

SUMMARY

The present invention provides a method for verifying a digital circuit design. This method focuses on unexpected interference so that other methods such as simulation can be used only on other verification issues.

This method uses 2 copies of the design under test. These 2 copies use different values (including primary inputs and initial states) to feed the supposedly irrelevant logic while using the same (or consistent as desired) values to feed the feature being verified. Symbolic method is used to efficiently determine whether the feature being verified behaves identically (or consistently as expected) in the 2 copies for all possible cases in the supposedly irrelevant logic. With the conclusive result from this method, the complexity for the other verification methods is much reduced because they can safely ignore the irrelevant logic.

DRAWINGS

FIG. 3 illustrates, in flow diagram form, a pseudo-random simulation process for utilizing a partial test bench.

FIG. 4 illustrates, in flow diagram form, an exhaustive simulation process for utilizing a partial test bench.

DETAILED DESCRIPTION

A method for verifying a digital circuit design in a hardware description language, using partial test benches, is disclosed.

Figure 1:
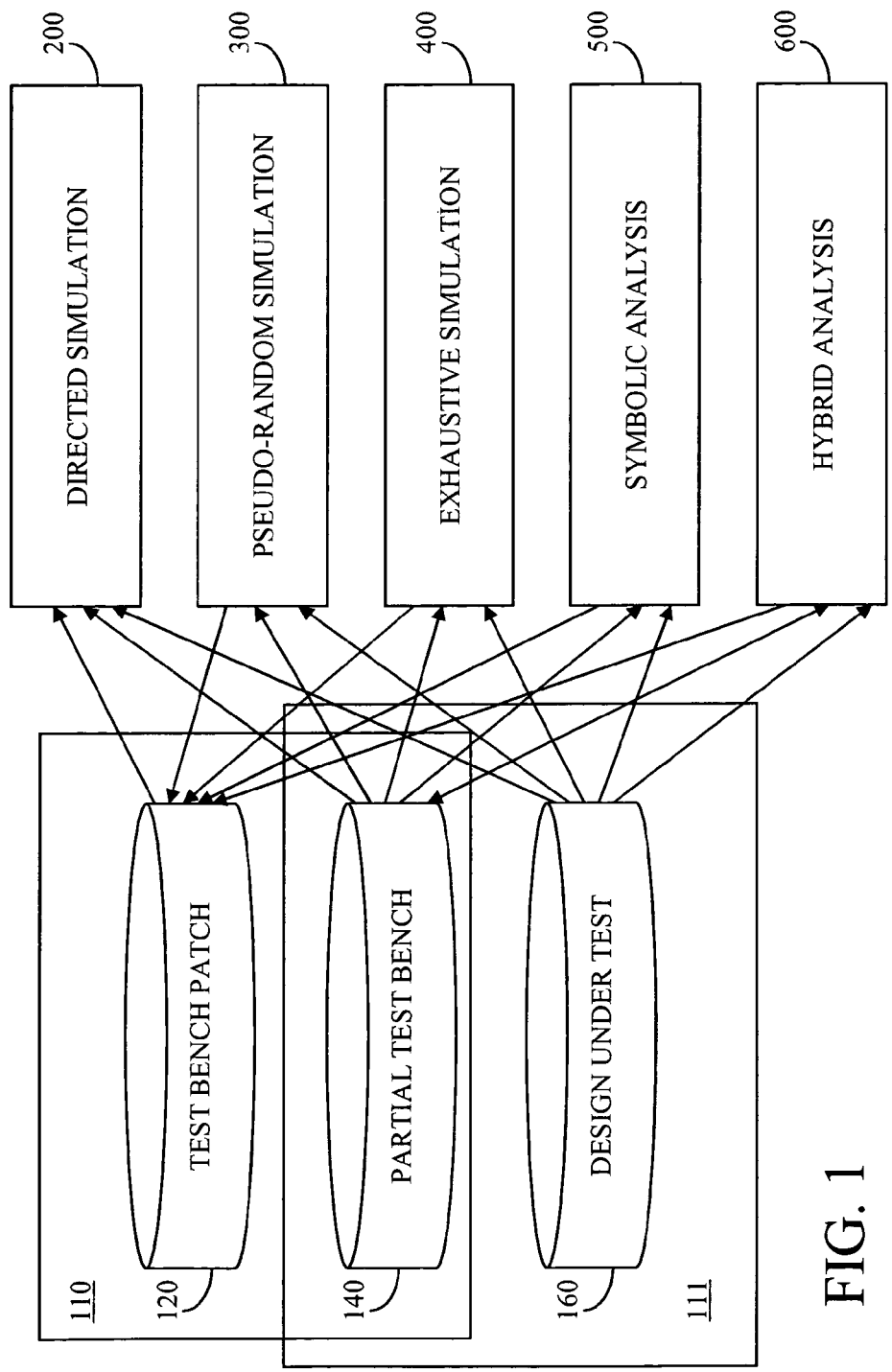
FIG. 1 illustrates, in block diagram form, a verification structure with a partial test bench and five verification processes of its applications.

FIG. 1 illustrates a test bench 110 comprising a test bench patch 120 and a partial test bench 140. Test bench 110 is used to verify a design under test 160. Partial test bench 140 and design under test 160 make a verification structure 111. It is known in the prior art that a process of directed simulation 200 takes test bench 110 and design under test 160 as inputs. In preferred embodiments of the present invention, a process of pseudo-random simulation 300, a process of exhaustive simulation 400, a process of symbolic analysis 500, or a process of hybrid analysis 600 take partial test bench 140 and design under test 160 as inputs and optionally generate test bench patch 120 as output. This output can be used for debugging the causes of the reported problems from these processes. Hybrid analysis 600 can also generate partial test bench 140 as output, and this output can be used for post-processing analysis of functional coverage (i.e. whether certain conditions are involved in hybrid analysis 600 or not).

Design under test 160 describes a digital circuit, which comprises wires and circuit components and is written in a hardware description language. Test bench 110 provides values to some of these wires, and the values of a wire can be different for different clock cycles. Assuming the circuit is synchronous, the circuit operation time in simulation is counted in clock cycles of a real clock. Otherwise, the circuit operation time in simulation can be counted in clock cycles of an imaginary clock. Depending on the hardware description language, the values from test bench 110 may override the connections within design under test 160, which can be used to simulate only a part of design under test 160. Partial test bench 140 provides some of these wire values, and test bench patch 120 provides some other wire values. It is possible for values from test bench patch 120 to override values from partial test bench 140. It is also possible for partial test bench 140 to provide values of a wire for some clock cycles and for test bench patch 120 to provide values of this wire for other clock cycles because any part of test bench 110 can include descriptions of any circuit components. Some of these values may be only provided in test bench patch 120.

The clock signals (not shown) may be identified based on information in design under test 160, test bench 110 or other interfaces to hybrid analysis 600, symbolic analysis 500, exhaustive simulation 400, pseudo-random simulation 300 or directed simulation 200. These other interfaces may include command line options, additional input files, interactive inputs or simply default conventions. The clock signals may or may not explicitly appear in these descriptions, and it is possible that a clock signal is implied in the delay values. The clock frequencies can be calculated from oscillators or from other delay values in any of these descriptions. When a clock signal is implied, its cycle time simply has to be a unit (or a common factor) of all delay values so that all these delay values can be implemented as the delays between events in the synchronous logic based on this clock signal.

Design under test 160 may also include memory elements, such as registers. The initial value of a memory element may be not specified, or may be specified in design under test 160, in partial test bench 140, or in test bench patch 120.

The values of the wires for various clock cycles and the initial values of the memory elements (such as registers) can be fed by some structure in test bench 110. This is a way to specify constraints on these values or dependencies among these values. The feeding structure may depend on the circuit behavior of design under test 160, and it may include various constant values or unfed wires as design under test 160 may. An unfed wire usually has a predetermined default value as defined by the hardware description language because there is no feeding structure to provide the wire's value. Each of these constant values and default values can be 0, 1 or others. If the value is neither 0 nor 1, it sometimes may be interpreted as 0 or 1. If it is neither 0 nor 1 and it is not interpreted as 0 or 1, it is treated as a series of wild cards 101 (shown in FIG. 7). Hybrid analysis 600, symbolic analysis 500, exhaustive simulation 400 and pseudo-random simulation 300 are free to interpret a wild card 101 as either 0 or 1. A series of wild cards 101 consists of a different wild card 101 for each different circuit operation time in simulation. An X (or unknown, don't-care, uninitialized, undefined, random, etc.) value or a default value of an unfed wire is generally treated as a series of wild cards 101 in a preferred embodiment of the present invention. A Z (high impedance) value may be interpreted as 0 in tri-state circuits if the tri-state connections are treated as wired OR.

Test bench 110 can have redundant logic, and it can include one or more refinement levels. Each refinement level can override values in any of the lower refinement levels. Each refinement level can also have missing logic to be completed by a higher refinement level. Each of these refinement levels can be in partial test bench 140 or test bench patch 120. It is a part of partial test bench 140 if it is used as input to pseudo-random simulation 300, exhaustive simulation 400, symbolic analysis 500, or hybrid analysis 600. It is a part of test bench patch 120 otherwise.

Each refinement level of test bench 110 may extend or completely replace the structure feeding the values of the wires and the initial values of memory elements. This extension or replacement may override some values in the feeding structure by adding more connections and more components. It therefore adds more constraints (or dependencies) although it may also remove or replace constraints (or dependencies). In this way, each refinement level can modify the coverage (the constrained space of these values) of partial test bench 140. A narrower coverage often results in a shorter turnaround time of a single run and possibly a lower efficiency in the overall solution because it divides the solution into several runs in a possibly imperfect way.

A signal's value is its default value if it does not get any value otherwise. This default value is overridden if a connection in another refinement level is added to feed this signal. Similarly a new refinement level may provide initial values to previously existing memory elements. If rules are defined in the hardware description language, any values (including wild cards 101) can be overridden with the added refinement levels.

Each refinement level of test bench 110 may include a different judging function 103 (only shown in FIG. 7) for deciding whether the circuit behavior of design under test 160 is correct. Each refinement level can also treat the output of judging function 103 at a lower refinement level as a part of the circuit behavior, or it may check the circuit behavior with an entirely new function while ignoring judging function 103 at the lower refinement level. A higher refinement level may also completely rely on judging function 103 at a lower refinement level. At least one such judging function 103 must exist in test bench 110. Judging function 103 may also depend on the behavior of the structure feeding values into design under test 160. Because this specification ignores syntax details, the term function means a block of logic with an output.

If a refinement level of test bench 110 includes multiple judging functions, these judging functions are always equivalent to one judging function 103 because the circuit behavior of design under test 160 is correct only if all judging functions indicate so.

Judging function 103 in use must be identified to hybrid analysis 600, symbolic analysis 500, exhaustive simulation 400 or pseudo-random simulation 300. It can be identified as an expression or a signal in a specific module, and this identification can be communicated via command line options, additional input files, interactive inputs, simply default conventions, etc. When identifying judging function 103 in use, it is also needed to identify (again via command line options, additional input files, interactive inputs, simply default conventions, etc.) both the expected value of this function and when in the circuit operation time in simulation (e.g. always, only at the end, or at a specified time) this value is expected (via an ending indicator). The ending indicator of the circuit operation time in simulation may be identified based on information in design under test 160, test bench 110 or other interfaces to hybrid analysis 600, symbolic analysis 500, exhaustive simulation 400, pseudo-random simulation 300 or directed simulation 200. These other interfaces may include command line options, additional input files, interactive inputs or simply default conventions. Sometimes, the ending indicator of the circuit operation time in simulation may be implicitly identified as the last circuit operation time in simulation that any value is expected in judging function 103.

There are many ways to represent constraints (or dependencies) in refinement levels of test bench 110. All these ways assure that the values of certain wires are among certain desired combinations. In other words, all these ways assure certain logic relationships among these values with certain predefined degrees of freedom. In some of these ways, the degrees of freedom are generally provided by wild cards 101 of some wires, and the logic relationships between the values to be constrained are provided by functions mapping from wild cards 101 to the values to be constrained. In some others of these ways, wild cards 101 of some wires provides more combinations than the desired combinations, and a function identifying the undesired combinations is provided to keep judging function 103 from checking any consequences of these undesired combinations. The function identifying the undesired combinations can be connected directly to judging function 103, or it can be connected directly to the ending indicator of the circuit operation time in simulation.

Figure 2:
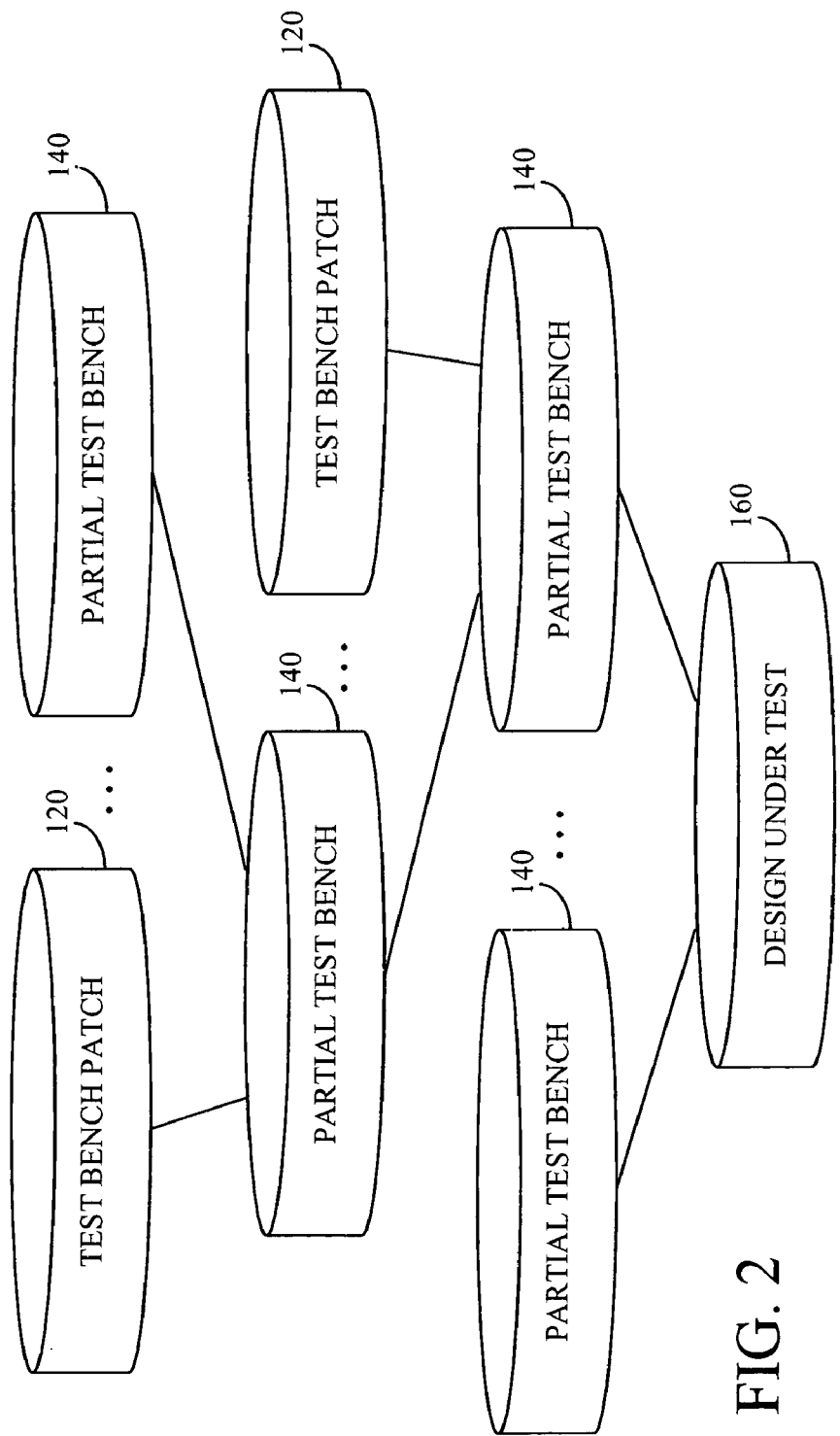
FIG. 2 illustrates, in block diagram form, an example tree structure of several test benches.

FIG. 2 illustrates many partial test benches 140 and test bench patches 120 that are used to verify design under test 160. Each of them can be used to verify a different feature of design under test 160. One additional refinement level of them can be used to verify a more restricted part of a feature. Each path from a test bench patch 120 to design under test 160 is a test bench 110. It also shows some paths without test bench patch 120.

Using a tree structure of partial test benches 140 and test bench patches 120, as illustrated in FIG. 2, is a way to divide the overall verification task for design under test 160. If a higher refinement level is connected to a lower refinement level, the higher refinement level covers a part related to what the lower refinement level covers. If several branches at a higher refinement level are connected to the same lower refinement level, the higher refinement level cover several parts all related to what the lower refinement level covers. These parts may or may not overlap with each other, and they may or may not jointly cover completely what the lower refinement level covers. Generally they are not desired to overlap. Complete coverage is generally desirable but a compromise is often needed for reasons such as resource limitations.

Only one path among the branches may be selected each time and it may or may not include the top refinement levels depending on what is identified through the interfaces to hybrid analysis 600, symbolic analysis 500, exhaustive simulation 400, pseudo-random simulation 300 or directed simulation 200. These interfaces may include command line options, additional input files, interactive inputs, etc. The collection of partial test benches 140 and test bench patches 120 are organized as a tree structure to support such selection easily and to support adding branches and refinement levels easily. Each addition may add a part to the tree structure or it may (partially or entirely) replace the structure with a modified version. Selecting a path of the tree structure may be done as selecting a conditional branch of the structured code (based on "if", "case", "ifdef", etc.) from the root up, or as picking simply the top refinement level in the branch if each refinement level identifies (via module instantiation, function/task/procedure/subroutine call, file inclusion, etc.) its next refinement level that is closer to the root. The choice between these two types of path selection is determined by the implementation coding style choice (related to statements, blocks, files, etc.) which is well known in the art of structured programming.

These refinement levels can be in different languages, in different formats, or in different styles. These representation attributes and other non-functional attributes may or may not be associated with certain functional attributes. These attributes may also indicate certain choices in the roles that they play in hybrid analysis 600, symbolic analysis 500, exhaustive simulation 400, pseudo-random simulation 300 or directed simulation 200.

FIG. 3 shows more details of pseudo-random simulation 300. After an initial step 320 of reading design under test 160 and partial test bench 140 from files, a step 330 is performed to identify wild cards 101. If an independent signal value can be interpreted as neither 1 nor 0, it is a wild card 101 for the initial value of a memory element or a series of wild cards 101 for the value of any other signal. The total circuit operation time in simulation needs to be identified because the number of wild cards 101 in each of such series is the total number of basic time units in the total circuit operation time in simulation. In a preferred embodiment of the present invention, the basic time unit is a clock cycle.

After step 330 there is a step 340 of assigning a pseudo-random binary value to each wild card 101. All independent values in design under test 160 and partial test bench 140 are 0's and 1's after step 340. Then a step 350 of binary simulation is performed. The simulation result of step 350 is checked in a step 360 based on judging function 103 in partial test bench 140. If the simulation result is incorrect, pseudo-random simulation 300 terminates with the pseudo-random values of all wild cards 101 saved in test bench patch 120 for further debugging. If the simulation result is correct, a step 370 is performed to decide whether any more iteration is needed. If needed, the sequence of steps 340, 350, 360 and 370 is repeated with a new set of pseudo-random binary values. If not needed, pseudo-random simulation 300 terminates with a correct result.

FIG. 4 shows more details of exhaustive simulation 400. It starts with a step 420 of reading files and a step 430 of identifying wild cards 101 in design under test 160 and in partial test bench 140. Step 420 and step 430 are the same as step 320 and step 330 respectively. A step 440 follows to assign a set of binary values to all wild cards 101 while assuring this set will never be repeated in future iterations. In a preferred embodiment of the present invention, each wild card 101 is represented by a bit in a binary number. Selecting the binary numbers of these bits sequentially will avoid repeating any set of binary values in a preferred embodiment of the present invention.

A step 450 of binary simulation and a step 460 of correctness decision are performed following step 440, and they are the same as step 350 and step 360 respectively. If the simulation result is decided to be incorrect in step 450, exhaustive simulation 400 terminates with the current values of all wild cards 101 saved in test bench patch 120 for further debugging. If the simulation result is correct, a step 470 is performed to decide whether there is any more set of binary values of wild cards 101. If the answer is yes, the sequence of steps 440, 450, 460 and 470 is repeated with the next set of binary values of wild cards 101. If the answer is no, exhaustive simulation 400 terminates with a correct result.

Figures 5, 6:
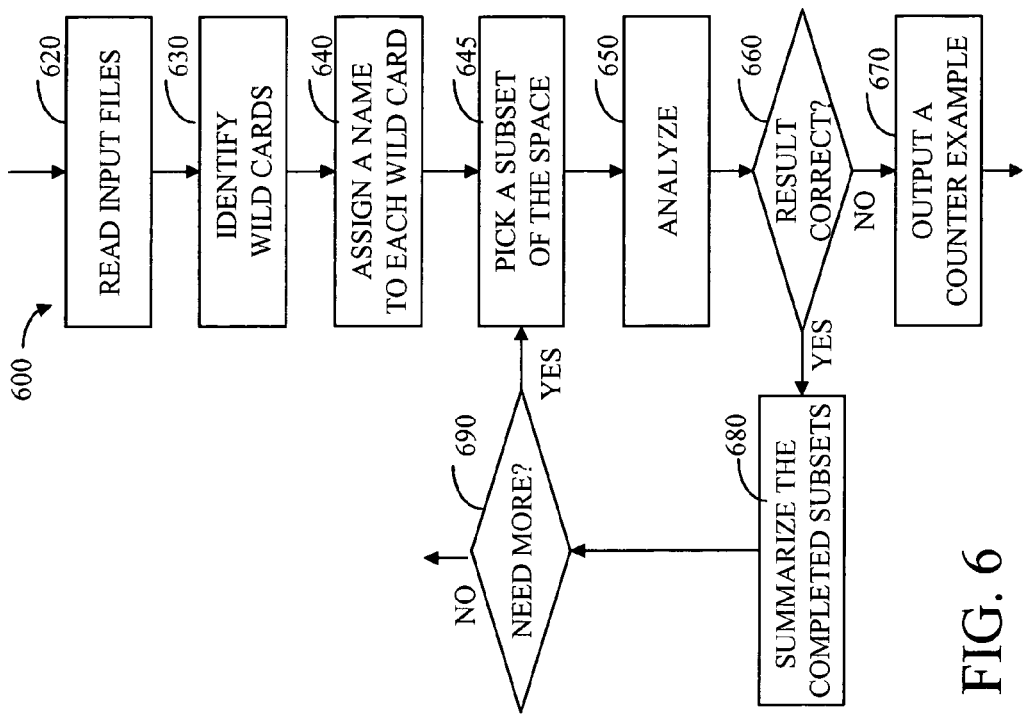
FIG. 5 illustrates, in flow diagram form, a symbolic analysis process for utilizing a partial test bench.
FIG. 6 illustrates, in flow diagram form, a hybrid analysis process for utilizing a partial test bench.

FIG. 5 shows more details of symbolic analysis 500. It starts with a step 520 of reading files and a step 530 of identifying wild cards 101 in design under test 160 and in partial test bench 140. Step 520 and step 530 are the same as step 320 and step 330 respectively.

A step 540 is performed to give names to all wild cards 101 after step 530. The names of different wild cards 101 must be different from one another. If a wild card represents the initial value of a memory element, the name of the wild card may include the name (with its position in the module hierarchy) of this memory element for easy correlation. If a series of wild cards represents a signal's default value, the name of each wild card in the series may include the signal's name (with its position in the module hierarchy) and the circuit operation time in simulation. If a series of wild cards represents a non-binary constant, the name of each wild card in the series may include, in addition to the circuit operation time in simulation, the constant's location in the source code files (of design under test 160 or of partial test bench 140) and the position in the module hierarchy where the constant is. If a constant's name is X, obviously many other constants may share the same name. The code location of a constant is not enough because the same code segment may be reused many times. If a constant (or a signal) represents many bits, different names are required for different bits. It is also possible to use numbers as any of these names if these numbers are not to be confused with constants.

The names from step 540 represent wild cards 101 as symbolic Boolean variables because a next step 550 treats design under test 160 and partial test bench 140 as Boolean equations of these variables. Step 550 analyzes these equations to evaluate the output of judging function 103 in partial test bench 140. In a preferred embodiment of the present invention, the method described in FIG. 7 and FIG. 8 (or the method described in U.S. Pat. No. 6,339,837, which is incorporated herein by reference) is used for step 550. A step 560 is the next to examine the result of step 550. If the result is correct, symbolic analysis 500 terminates with a correct result. If it is not correct, test bench patch 120 is generated, in a step 570, with a set of binary values of wild cards 101 to show, in directed simulation 200, how the incorrect result happens.

FIG. 6 shows more details of hybrid analysis 600. It starts with a step 620 of reading files and a step 630 of identifying wild cards 101 in design under test 160 and in partial test bench 140. Step 620 and step 630 are the same as step 320 and step 330 respectively. A step 640 is performed to give names to all wild cards 101 after step 630. Step 640 is the same as step 540.

The names from step 640 represent wild cards 101 as symbolic Boolean variables because next steps 645 and 650 treat design under test 160 and partial test bench 140 as Boolean equations of these variables. Step 645 adds a group of Boolean equations of these variables, and these equations reduce the degrees of freedom, which are provided by these variables. The simplest ones of these added Boolean equations simply assign constants to some of these variables. Step 645 is equivalent to automatic generation of one additional refinement level of partial test bench 140, and it can be performed in a different form before step 640 if desired. Generally it is desirable to perform this step late so that the loop is as small as possible.

Step 650 then analyzes all these equations to evaluate the output of judging function 103 in partial test bench 140. In a preferred embodiment of the present invention, the method described in FIG. 7 and FIG. 8 (or the method described in U.S. Pat. No. 6,339,837, which is incorporated herein by reference) is used for step 650. A step 660 is the next to examine the result of step 650. If it is not correct, test bench patch 120 is generated, in a step 670, with a set of binary values of wild cards 101 to show, in directed simulation 200, how the incorrect result happens. Steps 650, 660 and 670 can be the same as steps 550, 560 and 570 respectively.

If the result is correct according to step 660, a step 680 follows to generate a summary of the equations added in step 645 of all iterations so far. If a combination of the Boolean variables' values can satisfy the equation group added in step 645 of any iteration so far, it must also satisfy the equation group in this summary. This summary can simply include one equation stating that at least one of the equation group added in step 645 of any previous or current iteration must be satisfied. This summary can be optionally saved in the form of a new partial test bench 140, and this summary provides the constraints on the values combinations of the symbolic Boolean variables from step 640. This summary can be used for functional coverage checking later.

This summary is used in a step 690 to decide whether any more iteration is needed to cover more value combinations of the symbolic Boolean variables resulted from step 640. If there is no more combination to cover, hybrid analysis 600 terminates with a correct result. Otherwise, step 645 is performed to replace the added equation group from the previous iteration with a new equation group before going on to other steps of the new iteration.

It is possible to move some operations of step 660 to before the loop. This will make the process more efficient. One approach (used in a preferred embodiment of the present invention) to achieve this higher efficiency is to use the method described in FIG. 7 and FIG. 8 (or the method described in U.S. Pat. No. 6,339,837, which is incorporated herein by reference).

Figure 7:
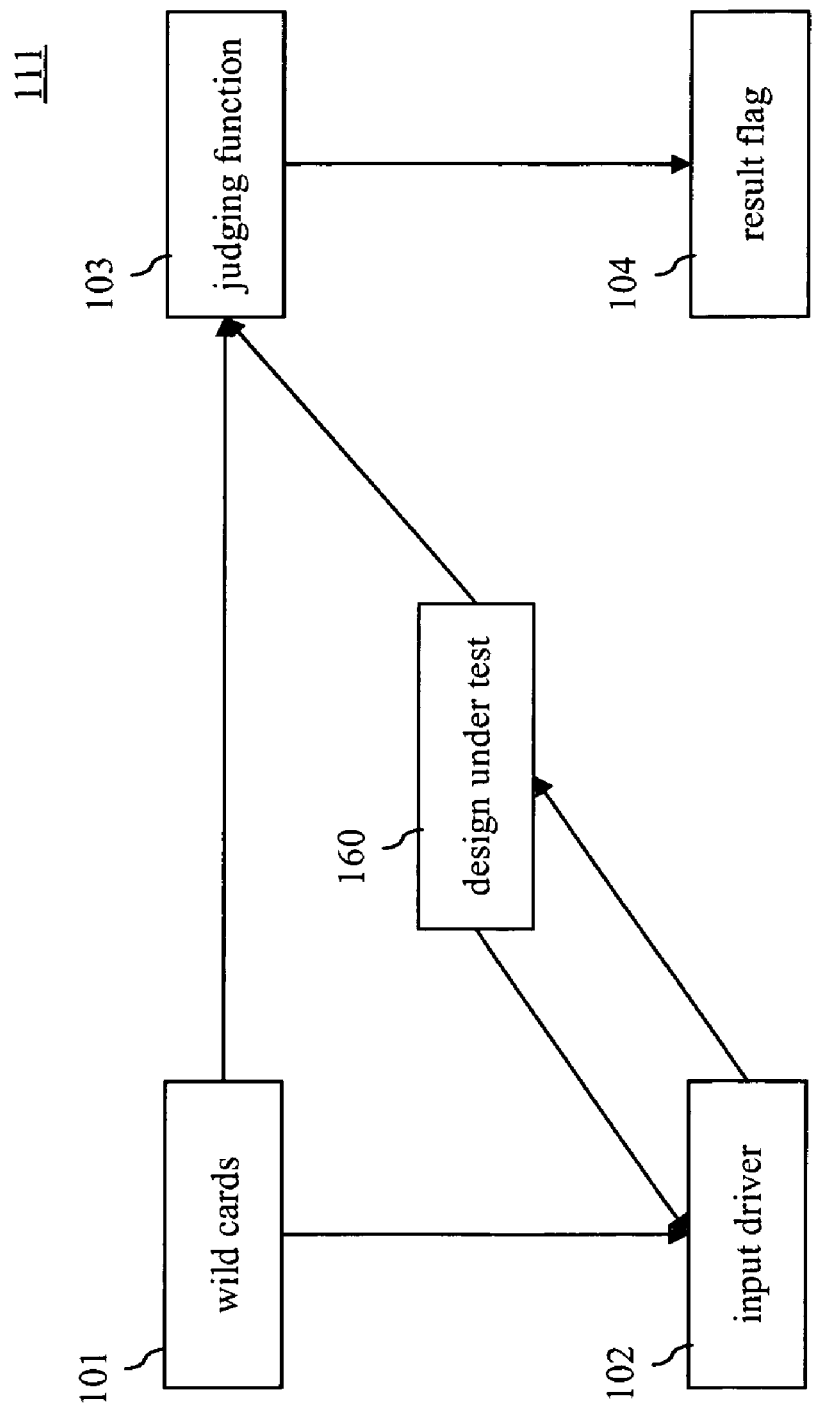
FIG. 7 illustrates, in block diagram form, a verification structure.

FIG. 7 illustrates verification structure 111 of a preferred embodiment of the present invention comprises design under test 160, wild cards 101, an input driver 102, judging function 103, and a result flag 104.

All these parts can be represented in a hardware description language, and they are physically in one or more electronic files in a storage area.

Design under test 160 is an instance of the design to be verified. A design can be used in an environment multiple times for different purposes, and each of these uses is an instance.

A clock (not shown in figures) is a specially identified wire in verification structure 111. The clock is shared by all parts of verification structure 111.

A number of wires without sources are used to represent wild cards 101 in the preferred embodiment of the present invention. Values on a wire for different clock cycles represent different wild cards 101, and values on different wires for a clock cycle also represent different wild cards 101. Each of wild cards 101 represents a degree of freedom because this wild card's value can be either 1 or 0. Therefore, n wild cards 101 represent 2 to the power of n different value permutations. The initial value of any uninitialized register also represents one of wild cards 101. In a preferred embodiment of the present invention, whether a register is initialized is controlled by a mechanism that selects one from several alternatives of implementation details of a component design. Some examples of this selecting mechanism are configurations in IEEE Standard 1076 and parameters in IEEE Standard 1364.

Input driver 102 can be a structural or behavioral description of a sequential or combinatorial circuit. The outputs of input driver 102 are connected to the inputs of design under test 160. The inputs of input driver 102 can include any wires representing wild cards 101, any constants, the clock, and any wires of design under test 160. Input driver 102 and wild cards 101 represent the constraints on the input values of design under test 160, including interrelations on the input values of design under test 160 and interactions between input driver 102 and design under test 160. These constraints define a space (or a collection) of input stimuli so that all test cases within this space can be processed collectively. Such collective processing then makes it possible to avoid repeating certain common operations. Wild cards 101 correspond to the degrees of freedom within this space. Usually input driver 102 comprises a number of constants and some behavioral description, and it may also include an ending indicator.

Judging function 103 has one and only one output, and this output is connected to result flag 104. The inputs of judging function 103 can include any wires representing wild cards 101, the clock, and any wires of design under test 160. Judging function 103 can include any circuit description (sequential or combinatorial) and it collects the concerned behavior of design under test 160. This behavior collection can include any interrelations between any wire values of design under test 160, either across different wires or across different clock cycles. Usually the inputs of judging function 103 include at least one wire of design under test 160, and the simplest embodiment of judging function 103 is a wire connecting a wire of design under test 160 to result flag 104. Judging function 103 usually also include an ending indicator as a part of the behavioral description. The value of the output of judging function 103 is not able to change after reaching the ending indicator regardless the activities in the rest of verification structure 111. In a preferred embodiment of the present invention, judging function 103 must include at least one ending indicator. It is possible for judging function 103 and input driver 102 to share some parts, including the ending indicator.

Result flag 104 is a specially identified wire. It can be identified in a number of ways, and one of the ways is to make it the only output of verification structure 111. Result flag 104 is the only observable point in verification structure 111 to the outside. Judging function 103 collects the correctness information in verification structure 111, and result flag 104 defines the predetermined polarity of the correctness. One predetermined value of result flag 104 represents that design under test 160 satisfies the behavioral expectation. This value can be identified in a number of ways, and this value is 1 in a preferred embodiment of the present invention. If result flag 104 is evaluated to have this value for the last clock cycle indicated by the ending indicator, design under test 160 is declared correct with respect to the constraints on the input values of design under test 160.

An ending indicator (not shown in figures) signifies the end of all value changes in the circuit part. This is supported by behavioral description capabilities of all hardware description languages. Its examples are a "wait" statement without arguments in IEEE standard 1076 (also known as VHDL), and $finish, $exit or the end of an "initial" statement in IEEE standard 1364 (also known as Verilog).

By providing both the input constraints in input driver 102 and wild cards 101 and the behavioral expectation in judging function 103 and result flag 104, one can easily divide the total verification task into multiple runs of the method in order to control the complexity of each run.

Verification structure 111 simply includes design under test 160 and some additional logic (called partial test bench 140 in FIG. 1), and then it transforms the verification task of each run into checking whether a Boolean function of wild cards 101 is equivalent to a predetermined Boolean constant. Initially this Boolean function is completely in a hardware description language, and there are needs to convert it to an easier-to-handle representation as long as the conversion process is not too costly.

Figure 8:
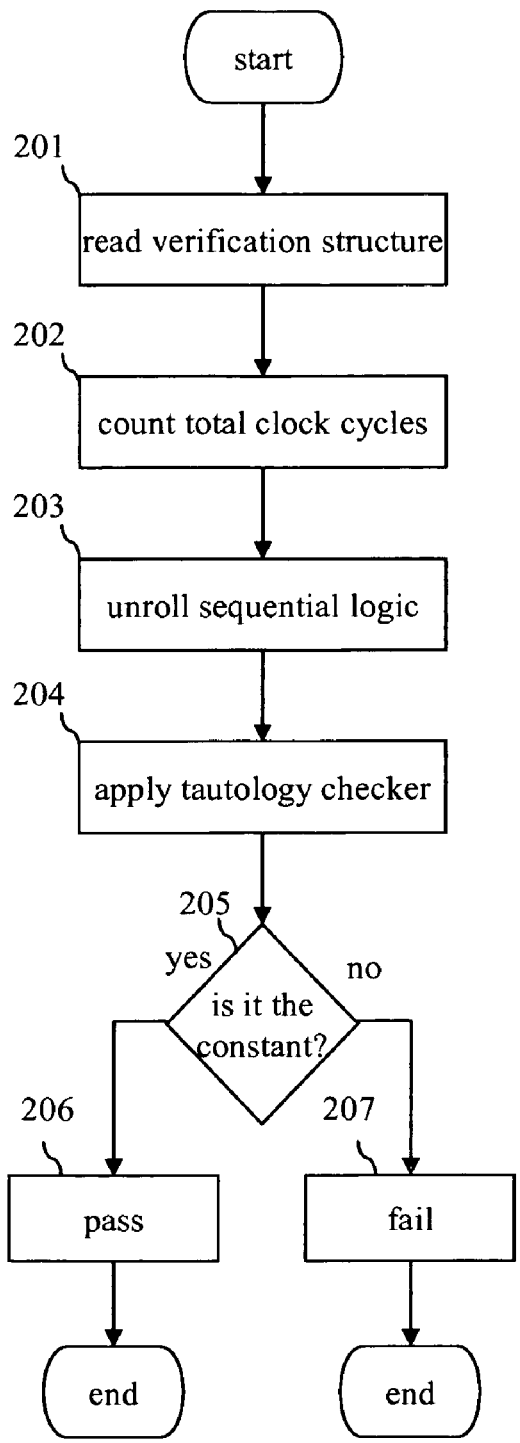
FIG. 8 illustrates, in flow diagram form, an algorithm for processing verification structure.

FIG. 8 illustrates a verification engine in an embodiment of the present invention, comprising four steps: an interpreter 201, a cycle counter 202, an unroller 203, and an equivalence checker 204. Interpreter 201 translates (or compiles) verification structure 111 from a hardware description language into a data structure representing a network of gates and registers. Other memory elements in verification structure 111 are also converted into gates and registers in interpreter 201 as known to ones skilled in the art. Cycle counter 202 lets the clock cycle number involved in the behavior be simulated up to the ending indicator. Unroller 203 traverses the network of gates and registers in the result of interpreter 201 from result flag 104, with the clock cycle number from cycle counter 202, to wild cards 101 and builds a data structure representing a network of gates. Unroller 203 copies the contributing gates for each clock cycle and connects the consecutive copies by replacing each register with a wire between its data input and its data output. If a register's clock is not active for a given clock cycle, unroller 203 replaces the gates feeding this register's data input with just a wire from this register's data output of the previous clock cycle. For the initial cycle, each register's data output takes the register's initial value if there is any, or otherwise one of wild cards 101. For the final cycle, the register inputs are ignored if they are not connected to result flag 104. Equivalence checker 204 determines whether the network of gates makes the final cycle's copy of result flag 104 (generated by unroller 203) equivalent to the predetermined value of result flag 104. The answer from equivalence checker 204 is taken to a decision point 205, which declares the verification a success 206 if it is all positive. Otherwise it declares the verification a failure 207. All steps before taking the answer from equivalence checker 204 can include Boolean simplification techniques for the sake of reducing the amount of computation.

Figure 9:
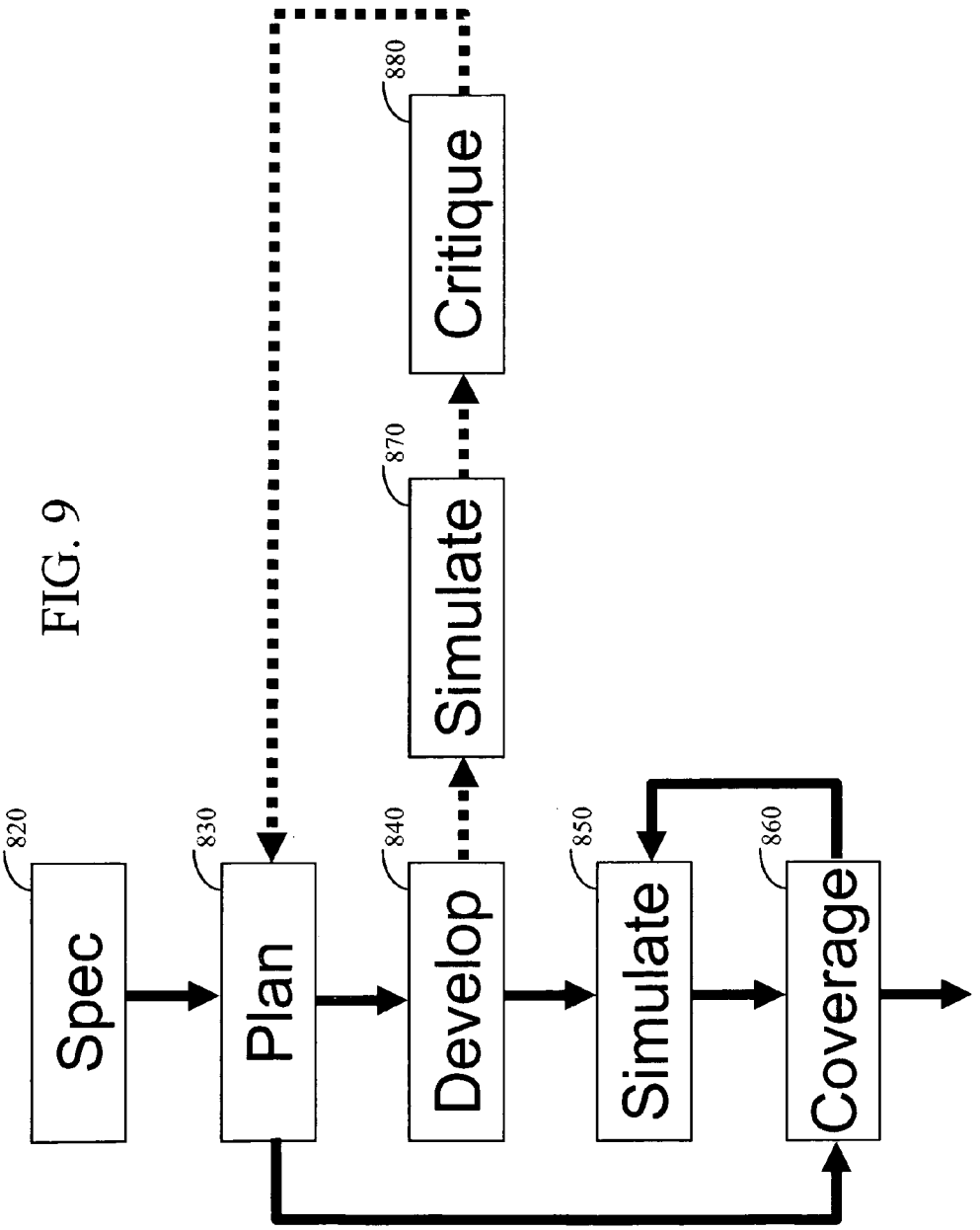
FIG. 9 illustrates, in flow diagram form, a process to verify the functional correctness of a digital circuit design.
Figure 10:
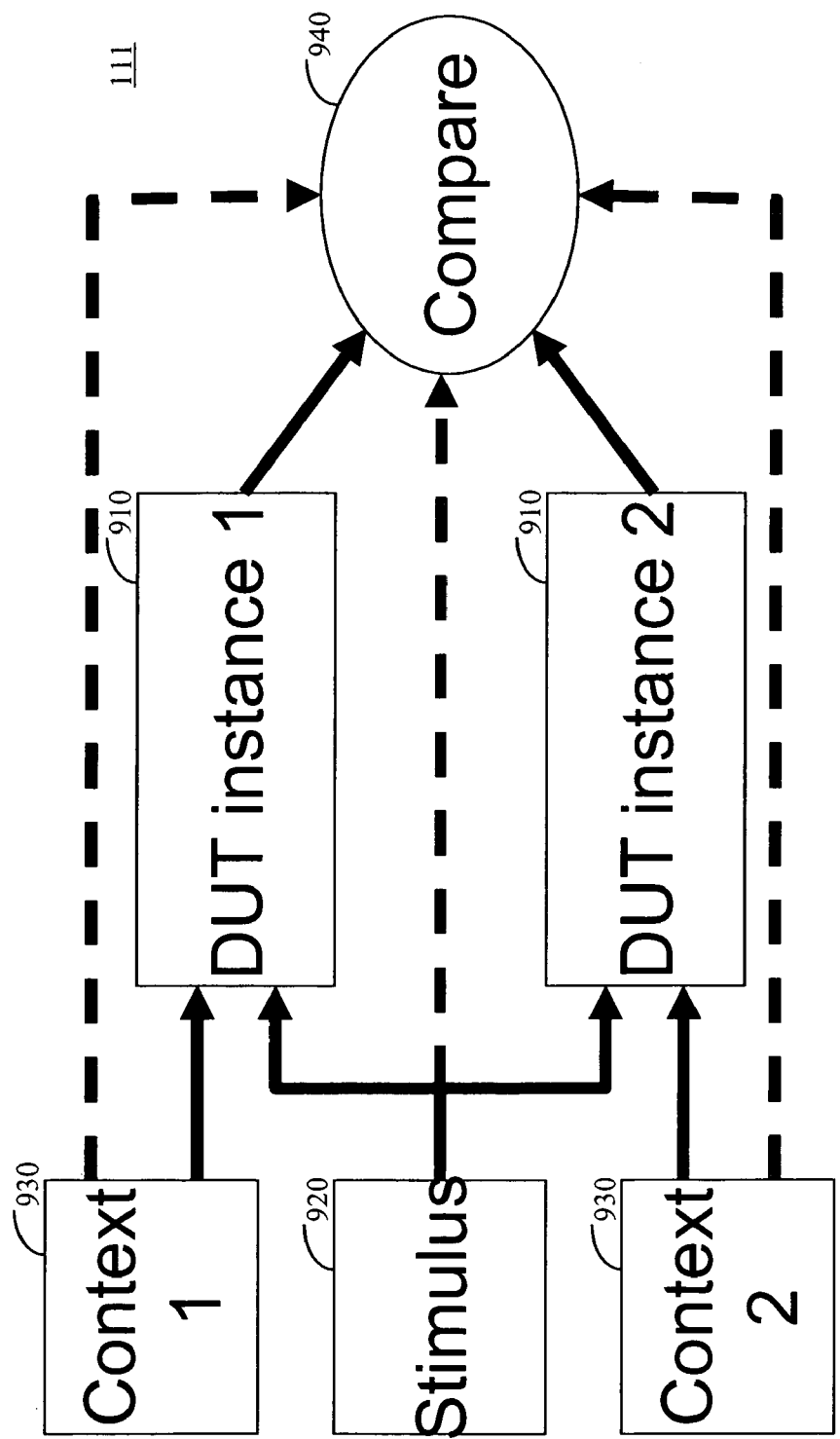
FIG. 10 illustrates, in block diagram form, a special verification structure used in the new steps in FIG. 9.
Figure 11:
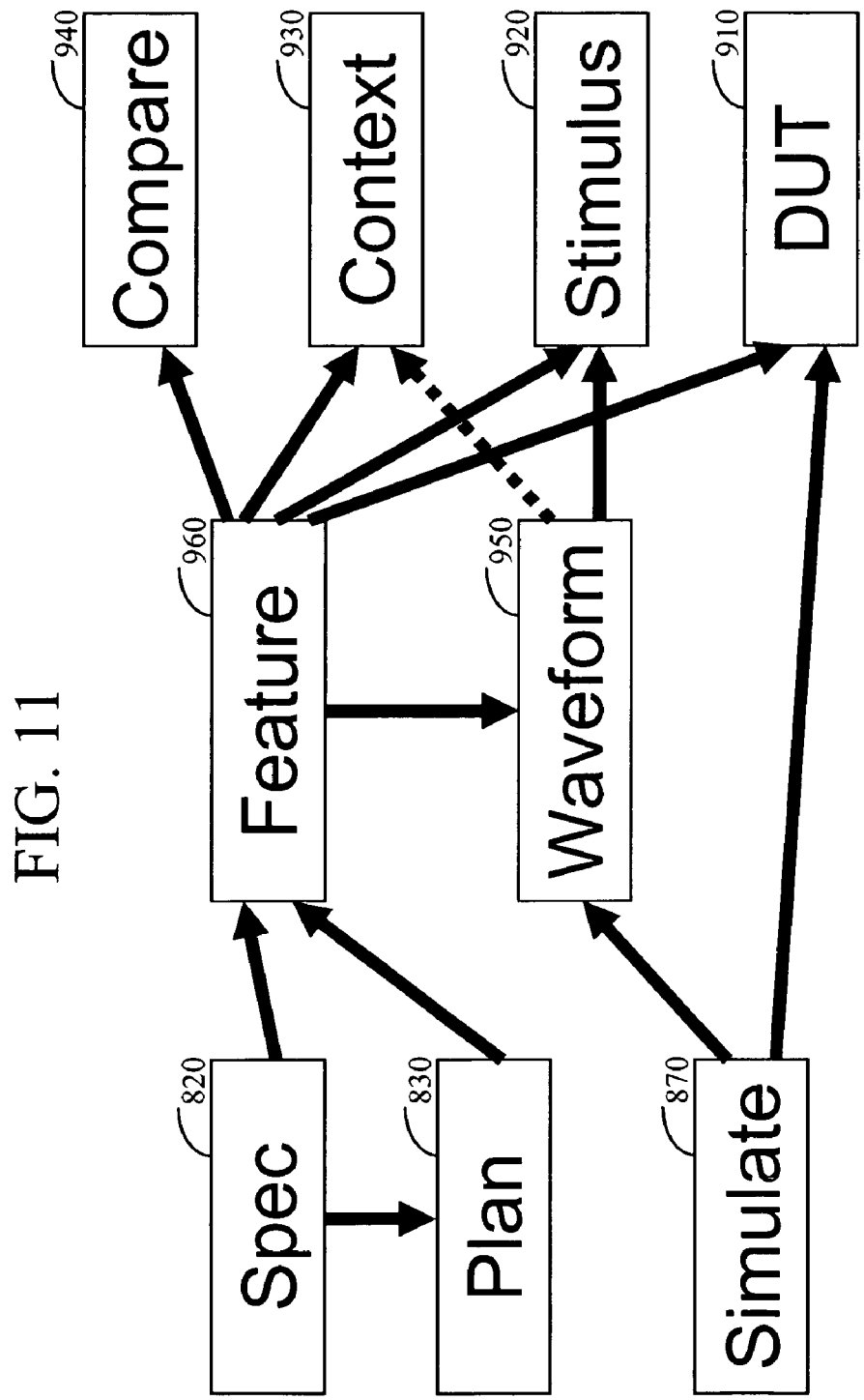
FIG. 11 illustrates, in flow diagram form, a process to create verification structure in FIG. 10.

An application of the above verification method is shown in FIG. 9 through FIG. 11.

FIG. 9 illustrates a process to verify the functional correctness of a digital circuit design. The solid line part with steps 820, 830, 840, 850 and 860 is the prior art part of the process, and the dotted line part with steps 830, 840, 870 and 880 is added by this invention.

Step 820 starts the process by getting a design specification, which is a document describing what the digital circuit is supposed to do. Step 830 makes a verification plan based on the design specification from step 820, and the verification plan defines (perhaps without going into all the details) what is supposed to happen in steps 840, 850, and 860. Step 840 develops verification code according to the verification plan from step 830. The verification code from step 840 can be similar to test bench 110 or it can be different. Step 850 executes the verification code from step 840. Step 850 may or may not be similar to any of directed simulation 200 pseudo-random simulation 300, exhaustive simulation 400, symbolic analysis 500, and hybrid analysis 600. Step 860 determines, according to the verification plan from step 830, when to stop looping back to step 850.

Step 830 is the key to the prior art part including steps 820, 830, 840, 850 and 860 because it defines the goal and the plan to achieve it. With digital circuits become more and more complex, step 830 is known to possibly produce an imperfect goal or an imperfect plan to achieve the goal because the goal and the plan to achieve the goal are both mentally created (and mentally critiqued) in step 830. To reduce possible mental mistakes in step 830, this invention adds steps 870 and 880 in the new branch.

Step 870 is similar to step 850, and it can be a round of step 850 if step 850 produces the result that is needed from step 870. The roles of step 870 and its result will be shown more clearly in FIG. 11, which illustrates how step 880 starts.

FIG. 10 illustrates verification structure 111 in step 880. Verification structure 111 in step 880 also shows why step 880 can reduce possible mental mistakes in step 830.

In the design specification from step 820, desired circuit operations are clearly defined in many circuit operation types. Generally a circuit operation type (also called a feature 960 in FIG. 11) is defined as the mapping from the input data values (possibly including some of the initial values of internal registers and some of the primary inputs' values) to the observed values. Here, the observed values can include both output values and internal signal values if it is possible to observe them. The input data values or the observed values can be either in a single clock cycle or in multiple clock cycles. A pattern (or patterns) of control values (a subset of the input values, including the initial values of internal memory elements and the primary inputs' values) is required to activate a specific circuit operation type rather than other circuit operation types.

A context 930 is defined as the independent signal values (of primary inputs in any clock cycle and of internal memory elements, such as registers, in the initial clock cycle) that should have no impact on the observed values of the given circuit operation type except the impact that is considered ignorable. What impact is ignorable normally depends on the nature of the given circuit operation type. For example, certain timing differences are considered ignorable for some given circuit operation types.

A stimulus 920 is defined as the independent signal values (of primary inputs in any clock cycle and of internal memory elements, such as registers, in the initial clock cycle) that are expected to have impact (not ignorable) on the observed values of the given circuit operation type.

Given a circuit operation type, it is possible that a (multiplexed) signal's values in certain clock cycles are in stimulus 920 and the same signal's values in other clock cycles are in context 930. Context 930 and stimulus 920 can be different for different circuit operation types. Both context 930 and stimulus 920 can include both primary input signal values and initial values of memory elements (including registers) in the digital circuit. If a primary input signal's values in all relevant clock cycles are in context 930, there may not be any need to connect this primary input signal to any source.

Some signal values in stimulus 920 are specific constants (and are called control values) because any other constants for these control values activate other circuit operation types instead of this one. The other signal values in stimulus 920 are called input data values because their changes do not change the circuit operation type though their changes result in the observed values' changes. For example, certain control values (including the instruction opcode) activate a circuit operation type called "floating point addition" in a CPU and the 2 operands of the floating point addition are input data values.

Two circuit operation types can be mutually exclusive or not mutually exclusive. For example, a CPU may not be able to do a floating point addition and a floating point division at the same time, but another CPU may.

Normally, all circuit operation types are described clearly in the design specification from step 820. In step 830, the verification coverage for each operation type is usually prioritized because it sometimes takes an impossible amount of resource to cover everything exhaustively. Normally, control values in stimulus 920 are covered completely because it is the lowest standard to cover each circuit operation type at least once. Input data values in stimulus 920 are also frequently covered extensively in the prior art. It is rare in the prior art to cover context 930 extensively because context 930 is frequently very large (taking too much resource to cover all permutations completely) and ideally it is irrelevant to the circuit operations. However, the circuit operation is incorrect if the supposedly irrelevant signal values become relevant. The present invention focuses on whether context 930 is really irrelevant (i.e. having no impact on the circuit operation's observed values) as expected. If it turns out to be relevant, either the design is incorrect or the division between stimulus 920 and context 930 is made incorrectly so that the verification plan from step 830 (and perhaps the design specification from step 820 as well) should be revisited. It is also interesting in some embodiments of the present invention whether the input data values play the expected roles.

As shown in FIG. 10, the key of step 880 is the division between stimulus 920 and context 930. To determine the impact of this division, a design under test (DUT) 910 is instantiated twice. These 2 instances of DUT 910 together represent design under test 160 (which now has 2 identical components) in FIG. 7. The 2 instances are connected to shared stimulus 920 but different context 930. If context 930 is really irrelevant as expected, the 2 instances of DUT 910 should feed the same observed values (except some tolerable or expected differences) to a comparison logic 940, a special form of judging function 103. Comparison logic 940 should compare observed values from the 2 instances in a single clock cycle or in multiple clock cycles as needed. In some cases, comparison logic 940 may tolerate certain differences such as timing differences (with waiting loops, etc.) in a conditional style (controlled by certain values in stimulus 920, by certain values in stimulus 920 or certain given constants) if so desired. If comparison logic 940 accepts the observed values from the 2 instances of DUT 910 as the same (except the tolerable or expected differences) for all possible cases of context 930 and stimulus 920, it is safe (for the verification plan from step 830) not to cover many permutations of the context 930.

In some embodiments of the present invention, the exact expected relationship between context 930 and the tolerable or expected differences is described in comparison logic 940.

In some other embodiments of the present invention, the tolerable or expected differences are described as general restrictions (independent of the specific values in context 930) in comparison logic 940. In the simplest embodiments of the present invention, no differences are tolerated or expected at all in comparison logic 940, which is therefore symmetric.

In the prior art, judging function 103 often directly depends on stimulus 920 and context 930. This dependence is not required for comparison logic 940 in this method, but it can also be employed. This dependence is useful especially if verification structure 111 is used to show the correct roles of both context 930 and stimulus 920.

FIG. 11 illustrates how to create verification structure 111 in FIG. 10. DUT 910 is also used in step 870 (and in step 850 as well) and therefore can be directly copied over though it is needed twice only in step 880. A waveform 950 has to be generated from step 870, and this is the reason of step 870's existence. A part of waveform 950 becomes stimulus 920 while some values (control values in stimulus 920) in this part are kept and some other values (input data values in stimulus 920) in this part are turned into wild cards 101. Another part of waveform 950 becomes context 930 because its values are partially or completely kept for the first instance of DUT 910 and completely turned into wild cards 101 (i.e. discarded) for the second instance of DUT 910.

It is not important how much waveform 950 in context 930 is kept for the first instance of DUT 910 as long as no part of context 930 is shared between the 2 instances of DUT 910 so that the values in context 930 are not forced to follow any relationship between the 2 instances of DUT 910. The reason of this is that the 2 instances of DUT 910 are used to determine whether 2 different test cases generate the same observed behavior (except the tolerable or expected differences), and this relationship between test cases is transitive as equality is. In some embodiments of the present invention, context 930 is formed by completely discarding values in this part of waveform 950 for both instances of DUT 910 as long as no part of context 930 is forced to follow any relationship between the 2 instances of DUT 910. The entire stimulus 920 must be shared between the 2 instances of DUT 910 so that the connections between stimulus 920 and the first instance of DUT 910 are exactly the same as the connections between stimulus 920 and the second instance of DUT 910. DUT 910's input values, including its primary inputs' values within certain time limit and its memory elements' initial values, must all either in context 930 or in stimulus 920. Context 930 and stimulus 920 are only used to provide DUT 910's input values including its primary inputs' values and its memory elements' initial values.

As shown in FIG. 11, all of DUT 910, stimulus 920, context 930 and comparison logic 940 depend on feature 960. Feature 960 depends on the verification plan from step 830 and the design specification from step 820, while the verification plan from step 830 depends on the design specification from step 820 as shown here and also previously in FIG. 9. Feature 960 is called circuit operation type when describing FIG. 10. Many different levels of circuit operation types can be extracted out of the design specification from step 820. The correct selection of one from these levels sometimes depends on how the verification plan from step 830 handles these levels and it also depends on what fits the tool the best. An incorrect selection will cause failure until the selection is adjusted to use smaller circuit operation. Smaller circuit operations are safer, but very small ones are inconvenient to use. The stimulus generation part (possibly similar to input driver 102) of the verification code from step 840 is sometimes helpful in this selection. If the functional coverage goal is defined well, feature 960 can be extracted from the functional coverage definition where each elementary unit of functional coverage represents a circuit operation with a specific pattern of stimulus 920 but with no specific pattern of context 930. In this way, steps 870 and 880 are used to evaluate the quality of the functional coverage definition.

The selection of feature 960 results in that DUT 910, stimulus 920, context 930 and comparison logic 940 all follow feature 960's definition in the design specification from step 820. DUT 910 must include the relevant logic for supporting feature 960 while using smaller DUT 910 is generally preferred for efficiency. Stimulus 920 must include all control and input data values (in DUT 910's input values, including initial values of memory elements and values of primary inputs) that should have impact on feature 960's observed values. Context 930 has DUT 910's input values (including initial values of memory elements and values of primary inputs) that should have no impact (or ignorable impact) on feature 960's observed values. Feature 960 also determines which parts (e.g. time interval) of waveform 950 are useful, and there is no need to record the useless parts of waveform 950 in step 870 though it is often easier to extract the useful parts after indiscriminating recording.

Comparison logic 940 in some embodiments of the present invention just determines whether the observed values from the first instance of DUT 910 are the same as the corresponding observed values from the second instance of DUT 910 while only considering the observed values (of certain selected signals at certain selected times) relevant to feature 960. The term "observed value" here and earlier in this specification refers to any signal value that shows the functional correctness of feature 960, and it can be a value (at a specific time) of an internal signal or of an output signal in DUT 910. Sometimes, this comparison logic 940's decision tolerates certain differences (for example, certain timing differences: either everything's timing shifted together or the relative timing difference between parts of the observed values changed) if it fits the definition of feature 960. It is often good for comparison logic 940 to properly expect differences in the observed values depending on the different wild card values in stimulus 920 (as in judging function 103) in some embodiments of the present invention.

The construction method of comparison logic 940 to achieve these goals is well known in the art (due to the relationship with judging function 103), and it can often be automated based on the result checking part of the verification code from step 840. In one embodiment of the present invention, comparison logic 940 simply records the observed values from both instances of DUT 910 and compares the 2 copies with each other when the recording is completed.

It is likely that some of DUT 910, stimulus 920, context 930 and comparison logic 940 are different if feature 960 is different. A specific selection of feature 960 usually only addresses one of many parts of the verification plan from step 830. This is clear if we consider that there are many circuit operation types in the design specification from step 820.

After clarifying how to obtain all the parts in FIG. 10, i.e. verification structure 111 in step 880, the focus has to be shifted on to how to process verification structure 111 in step 880. A key issue here is in context 930.

Context 930 is obtained by turning values from waveform 950 into wild cards 101. This implies that context 930 involves signals with no known values at the specific times. This means that context 930 should include all permutations of all possible values of these signals at these specific times. Similarly, the input data value part of stimulus 920 should also include all possible permutations of the input data values of stimulus 920. As the result, step 880 determines whether context 930 is truly irrelevant as expected for all possible cases of stimulus 920.

Connecting stimulus 920 (especially the input data values) into comparison logic 940 also can show the correctness of stimulus 920's impact in step 880. The role of stimulus 920 in comparison logic 940 needs to involve only one instance of DUT 910 because comparison logic 940 also assures the same for the other instance of DUT 910. It is well known in the art how comparison logic 940 can show the correctness of stimulus 920's impact because it is done often in the verification code from step 840, especially in the verification code that use randomization techniques. Feature 960 is completely correct if the impact of both stimulus 920 and context 930 are correct because the behavior of feature 960 only depends on stimulus 920 and context 930. This is interesting because frequently the impact of all possible permutations of the input data values of stimulus 920 is not completely verified in the prior art, but the incorrectness of this part can cause design failure.

Some methods to process verification structure 111 in step 880 are disclosed in FIG. 1 through FIG. 8 and in U.S. Pat. Nos. 6,609,230 and 6,339,837, which are incorporated herein by reference. In verification structure 111 in step 880, each bit of discarded value in context 930 is used as a wild card 101, each bit of the input data values (not the control values) in stimulus 920 is also used as a wild card 101, and both instances of DUT 910 are used together as design under test 160 (with 2 identical parts) in FIG. 1 and in the U.S. Pat. No. 6,609,230. The more efficient hybrid analysis methods in FIG. 6 though FIG. 8 and in U.S. Pat. Nos. 6,609,230 and 6,339,837 are especially recommended in a preferred embodiment of the present invention.

Because all inputs of design under test 160 get either constant values or wild cards 101 (instead of some complex logic or constraint) in verification structure 111 in some embodiments of the present invention, the structure of verification structure 111 is so simple that it can be automatically generated from a computer program. When automatically generating such code, all constant values are from waveform 950. Human input is needed to identify which parts of waveform 950 should become the input data value part of stimulus 920 so that these constant values in waveform 950 should be replaced with wild cards 101 and the first instance of DUT 910 must always have the same patterns in this input data value part of stimulus 920 as the second instance of DUT 910. Human input is also needed to identify which parts of waveform 950 should become context 930 so that these constant values in waveform 950 should be replaced with wild cards 101 and are free of any restrictions. Providing values in verification code from step 840 to inputs of design under test 160 is well known in the art, and the concept is similar for verification structure 111.

Comparison logic 940 can also be generated from human input in many situations. In the simplest situation, the human input specifies the signals and the times to observe. Then comparison logic 940 is generated to simply record the specified signal's values of both instances of DUT 910 at the specified times and to compare the corresponding values from the 2 instances of DUT 910. The recording and comparison actions can be in a conditional style, e.g. depending on some triggering events (as specified in the human input), to tolerate certain differences. The tolerated amount of differences can be dependent on both stimulus 920 and context 930, and this relationship can often be generated from the specific human input. Many code generation techniques known in the art can be used here because the logic is straightforward and the human input just provides certain arguments to the logic.

If the result from processing verification structure 111 in step 880 matches the expectation, the functional correctness of feature 960 is proven to be sufficiently independent of context 930. The same process needs to be repeated for different selections of feature 960 until having covered all interesting circuit operations.

If the result from processing verification structure 111 in step 880 does not match the expectation, the generated test bench patch 120 in FIG. 1 (or the generated test bench top in U.S. Pat. No. 6,609,230, which is incorporated herein by reference) is used with verification structure 111 to analyze the problem with a normal simulator in some embodiments of the present invention. The cause can be a bug in DUT 910. The cause can also due to some mistake or mistakes in the process. For example, it can be from the misunderstanding of the definition of feature 960. If the misunderstanding is caused by mistakes in the verification plan from step 830 or in the design specification from step 820, the source of the problem need to be fixed. After correcting the source of any problem, the process should be performed again to assure no more problems.

It is often a good idea to process known near miss cases to assure that context 930 is not too narrow. To do this, perform the above process with known incorrect understanding of feature 960. The analysis result should show the originally assumed mistake. Otherwise, it should be investigated why the originally assumed mistake turns out to be different. The investigation result might show that context 930 should be larger than what is originally assumed so that there is no need for the verification plan from step 830 to cover this new part of context 930.

Figure 12:
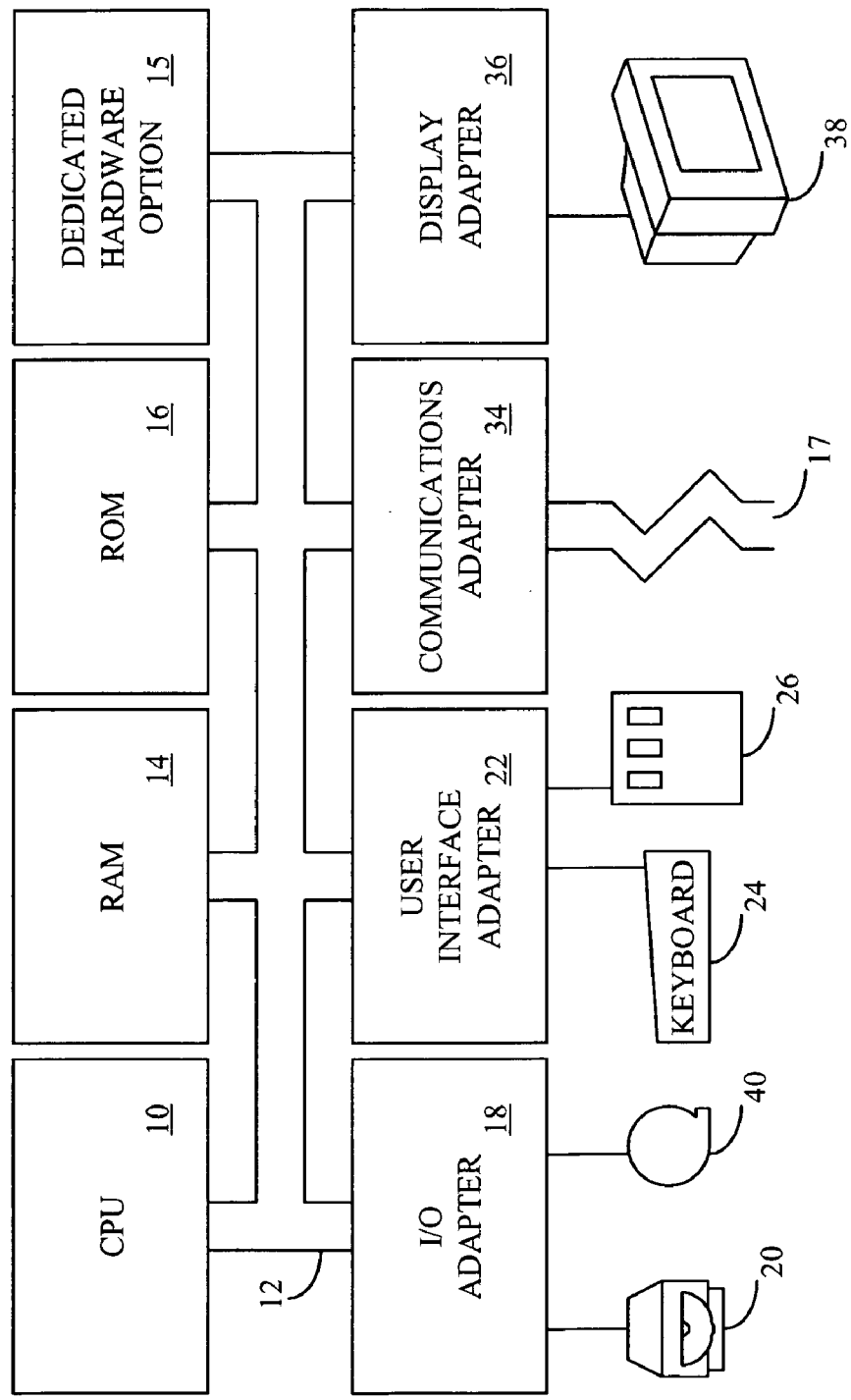
FIG. 12 illustrates a block diagram for computer system in accordance with the present invention.

The invention discussed above may be implemented within dedicated hardware 15 as illustrated in FIG. 12 or within processes implemented within a data processing system 13. A typical hardware configuration of a workstation, that may be implemented to accomplish the method disclosed herein, is illustrated and includes a central processing unit (CPU) 10, such as a conventional microprocessor, and a number of other units interconnected via a system bus 12. The workstation shown in FIG. 12 includes random access memory (RAM) 14, read only memory (ROM) 16, and input/output (I/O) adapter 18 for connecting peripheral devices, such as disk units 20 and tape units 40, to bus 12. A user interface adapter 22 is used to connect a keyboard device 24 and a mouse 26 to system bus 12. Other user interface devices such as a touch screen device (not shown) may also be coupled to system bus 12 through user interface adapter 22. A communication adapter 34 is also shown for connecting the workstation to a data processing network 17. Further, a display adapter 36 connects system bus 12 to a display device 38.

The method of the present invention may be implemented and stored in one or more of disk units 20, tape drive 40, ROM 16 and/or RAM 14, or even made available to system 13 via network 17 through communication adapter 34 and thereafter processed by CPU 10. Since the apparatus implementing the present invention is, for the most part, composed of electronic components and circuits known to those skilled in the art, circuit details will not be explained in any greater extent than that considered necessary as illustrated above, for the understanding and appreciation of the underlying concepts of the present invention and in order not to obfuscate or distract from the teachings of the present invention.

Figure 13:
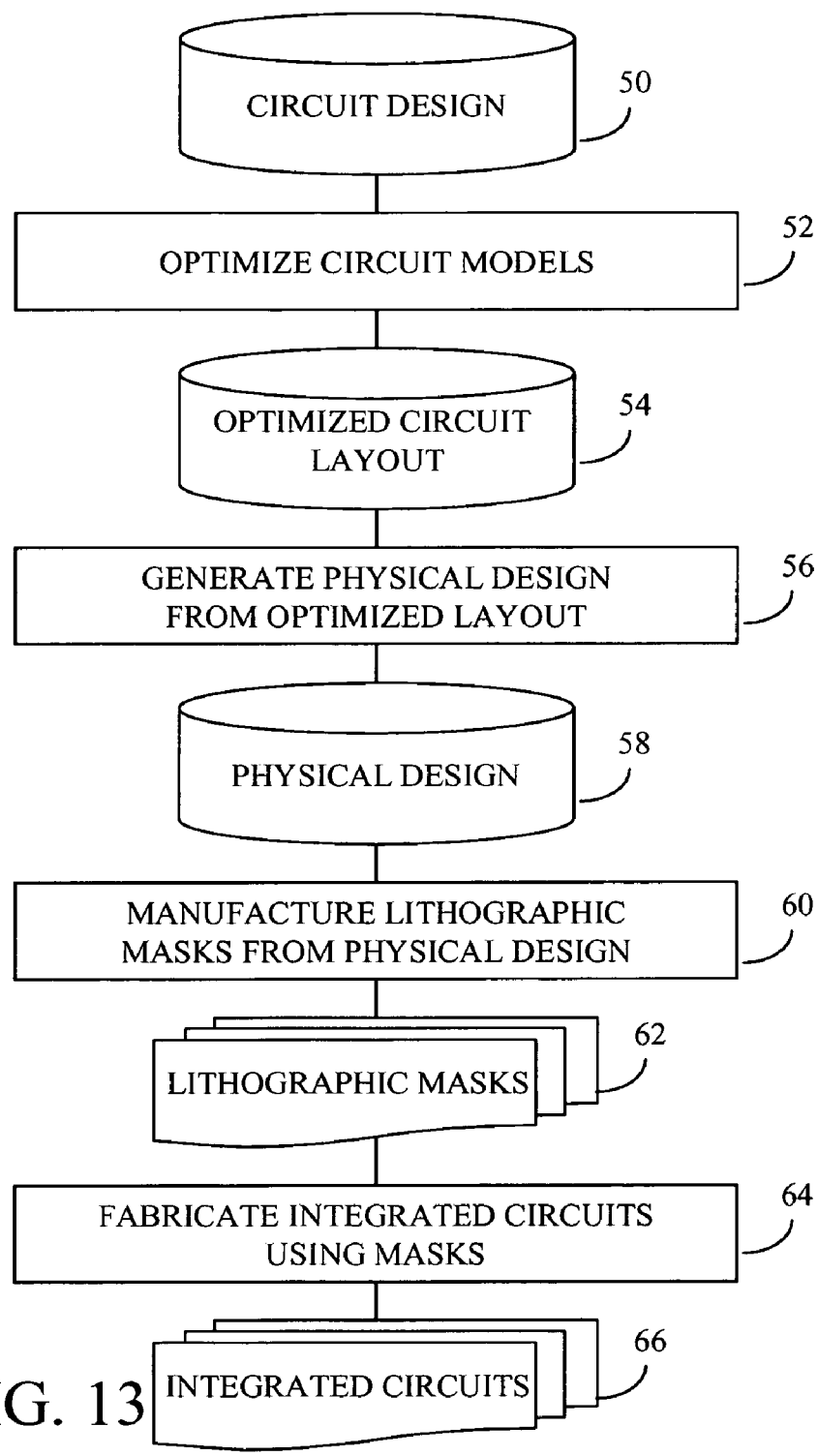
FIG. 13 illustrates a flow diagram for processing circuit designs in accordance with the present invention.

FIG. 13 is a block diagram that illustrates integrated circuit fabrication utilizing the correct circuit design resulting from using this verification method. An optimization tool 52 utilizes a circuit design 50 to generate an optimized circuit layout 54. A physical design file 58 is generated 56 from optimized circuit layout 54. Circuit design 50, optimized circuit layout 54, and physical design 58 are typically stored as data files on computer readable media such as disk units 20. Physical design file 58 includes integrated circuit dimensions, element dimensions, and element locations within the integrated circuit. Physical design file 58 locates elements and connections within a two-dimensional substrate area of an integrated circuit die. Preferably, physical design file 58 includes physical structure for performing the functions of an integrated circuit design from which physical design file 58 was derived. Physical design file 58 is converted 60 into a set of lithographic masks 62 corresponding to layers in the physical design file 58. Lithographic masks 62 are used to fabricate 64 integrated circuits 66.

The method taught herein is used to generate CAD (computer aided design) data files which contain information regarding an integrated circuit and placement of gates, transistors, and the like in the integrated circuit. Specifically, the present invention can be used when generating these files. These files are used to form lithographic masks that are then used to form a plurality of integrated circuits on a plurality of wafers using an integrated circuit fabrication facility. The uses of these files and masks are known to those skilled in the art.

While the above invention has been described with reference to certain preferred embodiments of the present invention, the scope of the present invention is not limited to these embodiments. One skilled in the art may find variations of these preferred embodiments which, nevertheless, fall within the spirit of the present invention, whose scope is defined by the claims set forth below.

I claim:

1. A method for verifying a digital circuit design comprising the steps of:
    picking a feature being verified in said digital circuit design;
    identifying, among primary inputs' values of said digital circuit design and memory elements' initial values of said digital circuit design, values supposedly irrelevant to said feature being verified;
    creating a first instance of said digital circuit design and a second instance of said digital circuit design;
    turning said values supposedly irrelevant to said feature being verified into wild cards in said second instance;
    collecting stimulus values for primary inputs' values of said digital circuit design and memory elements' initial values of said digital circuit design except said values supposedly irrelevant to said feature being verified;
    connecting said stimulus values to primary inputs' values of said digital circuit design and memory elements' initial values of said digital circuit design in said first instance in the same way as in said second instance except said values supposedly irrelevant to said feature being verified;
    determining values to observe in said digital circuit design for deciding the functional correctness of said feature being verified; and
    adding comparison logic to detect the predetermined consistency of said values to observe between said first instance and said second instance.

2. The method for verifying a digital circuit design of claim 1 wherein said stimulus values include at least one wild card, whereby said stimulus values include input data values.

3. The method for verifying a digital circuit design of claim 2 wherein said comparison logic in the adding step depends on said at least one wild card, whereby said comparison logic's report depends on some input data values.

4. The method for verifying a digital circuit design of claim 1 wherein said comparison logic is in a conditional style, whereby said comparison logic tolerates or expects certain behavior differences.

5. The method for verifying a digital circuit design of claim 4 wherein said comparison logic depends on said wild cards in the turning step, whereby said comparison logic's report depends on some of said values supposedly irrelevant to said feature being verified.

6. The method for verifying a digital circuit design of claim 1 wherein said comparison logic treats said first instance in the same way as said comparison logic treats said second instance, whereby said comparison logic is symmetric.

7. The method for verifying a digital circuit design of claim 1, further comprising the step of:
    obtaining a functional specification and a verification plan before the picking step.

8. The method for verifying a digital circuit design of claim 7 wherein said feature being verified is extracted, in the picking step, from said functional specification or said verification plan.

9. The method for verifying a digital circuit design of claim 1, further comprising the step of:
    recording a waveform from simulating said feature being verified after the picking step but before the identifying step and the collecting step.

10. The method for verifying a digital circuit design of claim 9 wherein said stimulus values are extracted, in the collecting step, from said waveform.

11. The method for verifying a digital circuit design of claim 9 wherein said values supposedly irrelevant to said feature being verified are extracted, in the identifying step, from said waveform.

* * * * *